United States Patent
Mochizuki et al.

(10) Patent No.: US 11,625,868 B2
(45) Date of Patent: Apr. 11, 2023

(54) CENTER LINE GENERATION DEVICE, NETWORK DATA GENERATION SYSTEM AND PROGRAM

(71) Applicant: NIPPON TELEGRAPH AND TELEPHONE CORPORATION, Tokyo (JP)

(72) Inventors: Mitsuru Mochizuki, Tokyo (JP); Kyota Tsutsumida, Tokyo (JP); Osamu Matsuda, Tokyo (JP); Hitoshi Seshimo, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 61 days.

(21) Appl. No.: 17/287,842

(22) PCT Filed: Oct. 18, 2019

(86) PCT No.: PCT/JP2019/041209
§ 371 (c)(1),
(2) Date: Apr. 22, 2021

(87) PCT Pub. No.: WO2020/085261
PCT Pub. Date: Apr. 30, 2020

(65) Prior Publication Data
US 2021/0390743 A1    Dec. 16, 2021

(30) Foreign Application Priority Data
Oct. 24, 2018 (JP) .............................. JP2018-200184

(51) Int. Cl.
*G06T 11/20* (2006.01)
*G06F 30/13* (2020.01)
*G09B 29/00* (2006.01)

(52) U.S. Cl.
CPC .............. *G06T 11/20* (2013.01); *G06F 30/13* (2020.01); *G09B 29/00* (2013.01)

(58) Field of Classification Search
None
See application file for complete search history.

(56) References Cited

U.S. PATENT DOCUMENTS

2011/0085707 A1* 4/2011 Gupta .................. G01C 21/206
382/113
2017/0147716 A1* 5/2017 Shirabe .................. G06F 30/13
(Continued)

OTHER PUBLICATIONS

Hurtado, Ferran, and Marc Noy. "Triangulations, visibility graph and reflex vertices of a simple polygon." Computational Geometry 6.6 (1996): 355-369. (Year: 1996).*

(Continued)

*Primary Examiner* — Ryan M Gray

(57) ABSTRACT

A centerline for generating network data of an indoor space can be generated while limiting the amount of calculation. Points where first straight lines and second straight lines constituting centerlines meet are created using re-entrant vertices (Step 1). The points created in Step 1 are connected by lines (Step 2). Connection lines corresponding to the longest sides are repeatedly deleted from closed polygons defined by the connection lines obtained in Step 2 until no closed polygons are left (Step 3). Each vertex of the connection lines obtained in Step 3 is connected to a farthest center point on the perimeter of the shape of the passage if there is such a farthest center point to which the vertex can be connected without touching the perimeter and without crossing other connection lines (Step 4).

20 Claims, 23 Drawing Sheets

(56) References Cited

U.S. PATENT DOCUMENTS

2018/0137214 A1* 5/2018 Benjamin ............... G06T 17/10
2022/0180595 A1* 6/2022 Bethi ..................... G06T 15/08

OTHER PUBLICATIONS

Liu, Jianfei, et al. "Semi-automated processing and routing within indoor structures for emergency response applications." Cyber Security, Situation Management, and Impact Assessment II; and Visual Analytics for Homeland Defense and Security II. Vol. 7709. SPIE, 2010. (Year: 2010).*
Nourollah, A., and S. Hosseini. "A new algorithm for shape reconstruction by the computational geometry approach." 2012 Third International Conference on Intelligent Systems Modelling and Simulation. IEEE, 2012. (Year: 2012).*
Taneja, Saurabh, et al. "Algorithms for automated generation of navigation models from building information models to support indoor map-matching."Automation in Construction 61 (2016): 24-41. (Year: 2016).*
Filippo Mortari (2013) "Automatic Extraction of Improved Geometrical Network Model from CityGML for Indoor navigation" Research Paper, Nov. 23, 2013, 139 pages.
Keiko Okuaki (2012) "Method to Generate the Line data of the Road Centerline Automatically along with the Attribute Data of Width of Road" Proceedings of the Geographic Information Systems Society [online] Website: https://www.gisa-japan.org/conferences/proceedings/2012/papers/D-1-4.pdf.

* cited by examiner

CENTER LINE GENERATION DEVICE, NETWORK DATA GENERATION SYSTEM AND PROGRAM

CROSS-REFERENCE TO RELATED APPLICATIONS

This application is a U.S. 371 Application of International Patent Application No. PCT/JP2019/041209, filed on 18 Oct. 2019, which application claims priority to and the benefit of JP Application No. 2018-200184, filed on 24 Oct. 2018, the disclosures of which are hereby incorporated herein by reference in their entireties.

TECHNICAL FIELD

The present invention relates to a centerline generation device, a network data generation system, and a program for generating centerlines for generating network data of an indoor space.

BACKGROUND ART

A method using the characteristics of Delaunay triangulation (Non Patent Literature 1) and a method using the characteristics of a Voronoi diagram (Non Patent Literature 2) are known in the related art as technologies for generating centerlines which are the sources of network data.

CITATION LIST

Non Patent Literature

Non Patent Literature 1: Filippo Mortari, "Automatic Extraction of Improved Geometrical Network Model from CityGML for Indoor navigation", <retrieved from the Internet: https://3d.bk.tudelft.nl/pdfs/FilippoMortari_thesis.pdf, date accessed: 2018 Oct. 5>

Non Patent Literature 2: Keiko OKUAKI, "Method to Generate the Linedata of the Road Centerline Automatically along with the Attribute Data of Width of Road", <retrieved from the Internet: https://www.gisa-japan.org/conferences/proceedings/2012/papers/D-1-4.pdf, date accessed: 2018 Oct. 5>

SUMMARY OF THE INVENTION

Technical Problem

Both the methods described in Non Patent Literatures 1 and 2 above have a problem that it takes time to perform processing for correcting generated centerlines because there are unnecessary parts in the generated centerlines.

The present invention has been made in view of the above circumstances and it is an object to provide a centerline generation device, a network data generation system, and a program which can generate centerlines for generating network data of an indoor space while limiting the amount of calculation.

Means for Solving the Problem

A centerline generation device according to the present invention to achieve the object is a centerline generation device for generating a centerline of a passage that is a movable region in an indoor space represented by two-dimensional vector data, the centerline generation device including a centerline generation unit configured to at least use a re-entrant vertex which is an element included in the two-dimensional vector data to generate a continuous centerline which does not cross a perimeter of the passage in the indoor space and includes a plurality of straight lines.

A network data generation system according to the present invention includes the centerline generation device and a network data generation device configured to generate network data which includes a link representing the passage and a node that is a starting or end point of the link based on the simplified centerlines.

A program according to the present invention is a program causing a computer to function as each unit included in the centerline generation device.

Effects of the Invention

As described above, the centerline generation device, the network data generation system, and the program of the present invention can achieve an advantage of enabling generation of centerlines for generating network data of an indoor space while limiting the amount of calculation.

DESCRIPTION OF EMBODIMENTS

Hereinafter, an embodiment of the present invention will be described in detail with reference to the drawings.

Overview

First, a method of generating centerlines using the characteristics of Delaunay triangulation will be described. In the method using the characteristics of Delaunay triangulation, an original shape is divided into Delaunay triangles and the centroids of the triangles are connected to generate centerlines.

Figure 24:
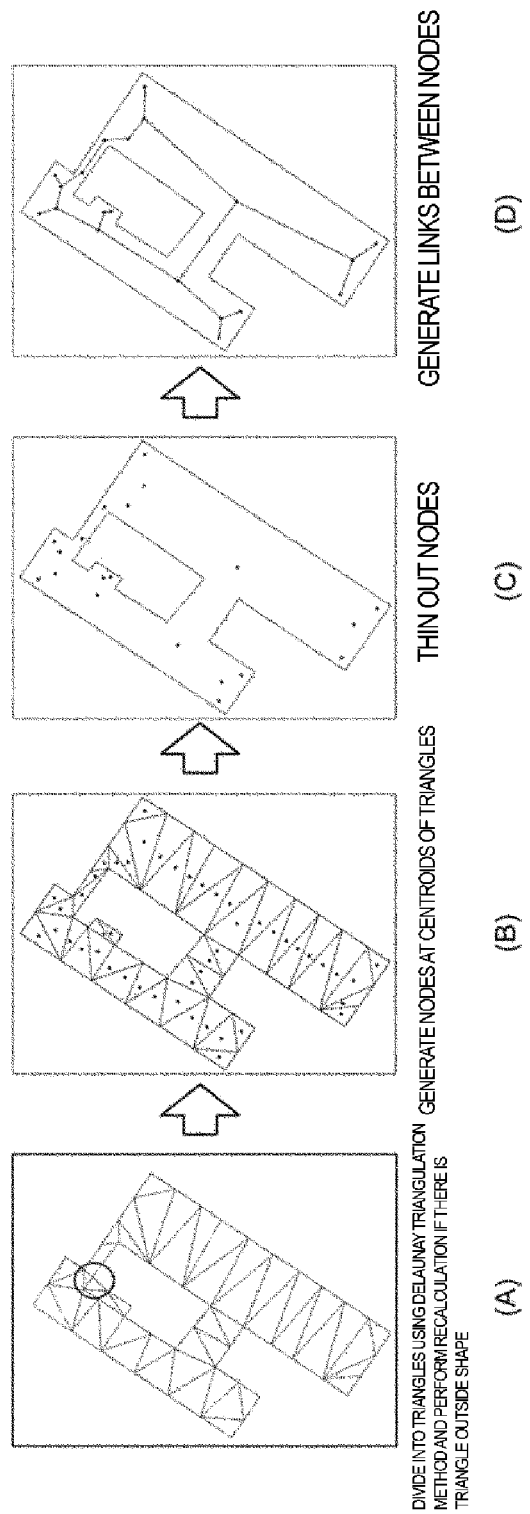
FIG. 24 is a diagram for explaining a method of generating centerlines using the characteristics of Delaunay triangulation.

Specifically, a shape is divided into triangles using the Delaunay triangulation method as illustrated in FIG. 24(A) and recalculation is performed if there is a triangle outside the shape. Then, nodes are generated at the centroids of the triangles as illustrated in FIG. 24(B).

Then, nodes are thinned out as illustrated in FIG. 24(C). Here, nodes which form a nearly straight line when connected are removed. Then, links are generated between the nodes as illustrated in FIG. 24(D). The method of generating centerlines using the characteristics of Delaunay triangulation as described above tends to increase the cost of network data generation depending on the complexity of the original shape due to the characteristics of the generation algorithm. Furthermore, the results of demonstrations showed that recalculation was repeated and it took time depending on the original shape.

Next, a method of generating centerlines using the characteristics of the Voronoi diagram will be described. In the method using the characteristics of the Voronoi diagram, points are set at regular intervals on the sides of the original shape and Voronoi polygons are generated from the group of points. Here, adjacent polygons are combined together and sides of the combined polygons inside the original shape are set as centerlines.

Figure 25:
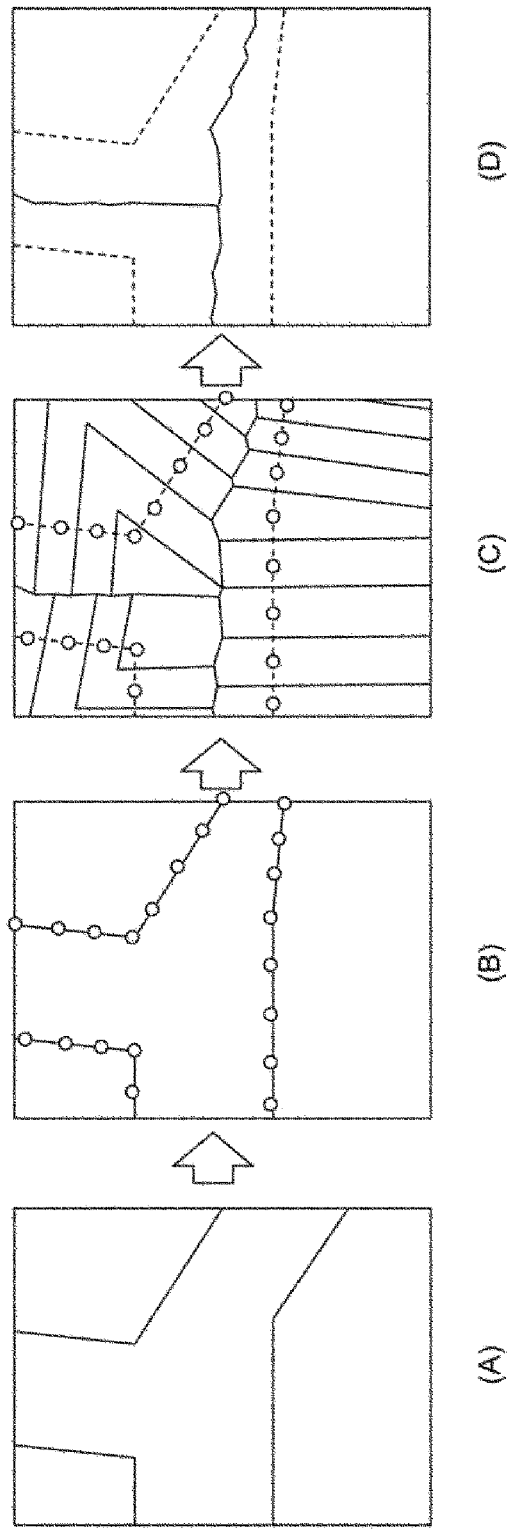
FIG. 25 is a diagram for explaining a method of generating centerlines using the characteristics of a Voronoi diagram.

Specifically, points are generated at equal intervals on the perimeter of the shape as illustrated in FIG. 25(A). Then, Voronoi polygons are generated for the generated points as illustrated in FIG. 25(B).

Then, sides of the Voronoi polygons that do not cross the perimeter of the original shape are set as centerlines as illustrated in FIG. 25(C). Further, as illustrated in FIG. 25(D), overlapping line segments are removed and vertices are thinned out to simplify the centerlines.

Centerlines generated using the characteristics of the Voronoi diagram in the above manner tend to increase the cost of network data generation depending on the complexity of the original shape due to the characteristics of the generation algorithm.

As described above, the generation results of both the method using the characteristics of Delaunay triangulation and the method using the characteristics of the Voronoi diagram include, as they are, many nodes and links that are useless for a network for route searching or the like. Thus, it also takes time to perform processing for minimum necessary correction to obtain network data for route searching after generating centerlines (such as thinning out of nodes in the method using the characteristics of Delaunay triangulation and removal of overlapping lines or thinning out of nodes in the method using the characteristics of a Voronoi diagram).

Therefore, as compared with the methods of the related art, the centerline generation device according to the embodiment of the present invention allows network data to be generated while recalculation is unnecessary and the generation cost is limited without greatly depending on the shape of the indoor space of input data.

Specifically, to generate network data for an indoor space, the shape of a passage of the indoor space is received as an input and a centerline which is a source of the network data is generated using features of the shape.

Here, the generated centerline is an uninterrupted line which does not cross the perimeter of the shape of the passage of the input indoor space and to which any internal position of the shape can be connected by a straight line. Because a centerline is generated by focusing on re-entrant vertices of the shape of the input indoor space, the generated centerline satisfies the requirement that it be an uninterrupted line which does not cross the perimeter of the shape of the passage of the input indoor space and to which any internal position of the shape can be connected by a straight line.

When the shape of an input indoor space has a large area or a large number of vertices, it is divided into grids and a centerline is generated for each grid and then centerlines of the grids are connected to generate a single centerline, thereby limiting the generation cost.

Also, if a connection made between centerlines of grids crosses a perimeter of a passage, a bypass centerline is generated, satisfying the requirement that it be an uninterrupted line which does not cross the perimeter of the shape of the input indoor space and to which any internal position of the shape can be connected by a straight line.

Figure 1:
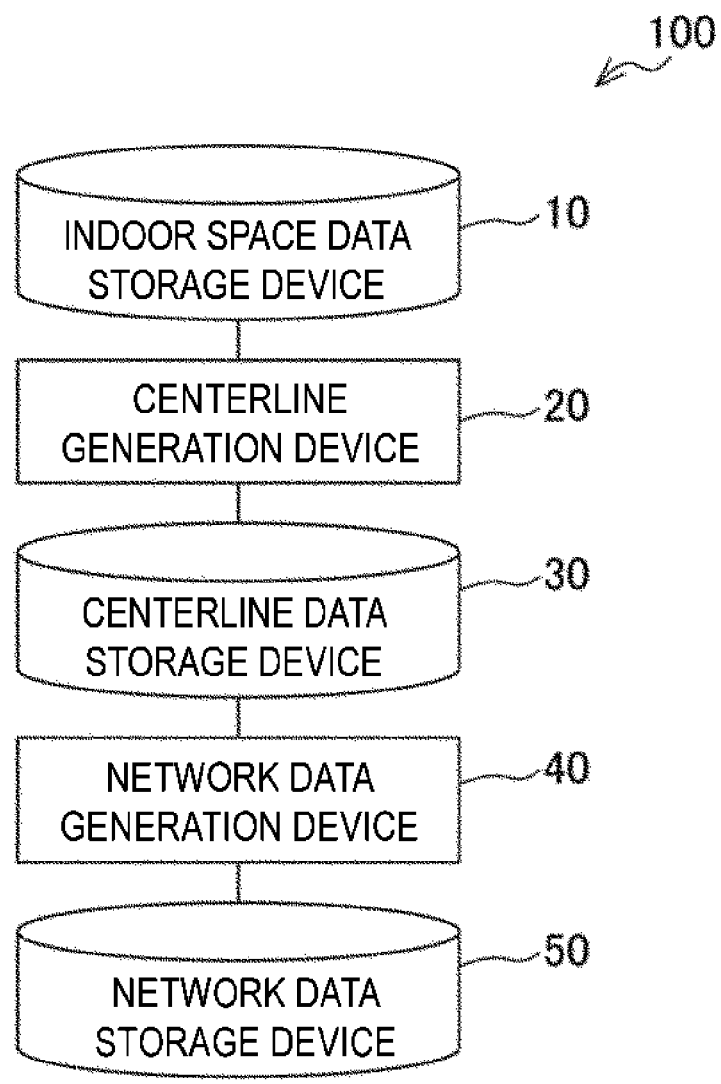
FIG. 1 is a block diagram of a network data generation system according to an embodiment of the present invention.

Configuration of Network Data Generation System According to Embodiment of Present Invention FIG. 1 is a block diagram illustrating a configuration of a network data generation system 100 according to an embodiment of the present invention.

Generally, digital vector data such as architectural 2D computer-aided design (CAD) data created for building design and a 3D model included in building information modeling (BIM) data is used to generate centerlines.

Architectural CAD here is software that creates drawings such as plan views, elevation views, cross-sectional views, and perspective views of the solids of constructions such as buildings and structures. Architectural CAD has a layer definition and generally divides columns, stores, toilets, escalators, and the like in addition to walls and corridors into layers and manages them in layers.

BIM manages digital models including three-dimensional building shapes and attribute information. BIM has a class definition. In industry foundation classes (IFC) which is one format of BIM data, classes are defined for structures such as floors, spaces, stairs, doors, and columns.

When BIM data is used, it is treated as 2D vector data through horizontal projection of each floor.

It is assumed that input data is managed with the shapes of rooms, passages, entrances and exits, stairs, elevators, and the like being already given meanings by layer and class definitions or the like.

The network data generation system 100 according to the embodiment of the present invention includes an indoor space data storage device 10 that stores the input data, a centerline generation device 20 that generates centerlines from the input data, a centerline data storage device 30 that stores the generated centerlines, a network data generation device 40 that automatically generates network data from the generated centerlines, and a network data storage device 50 that stores the generated network data.

Figure 2:
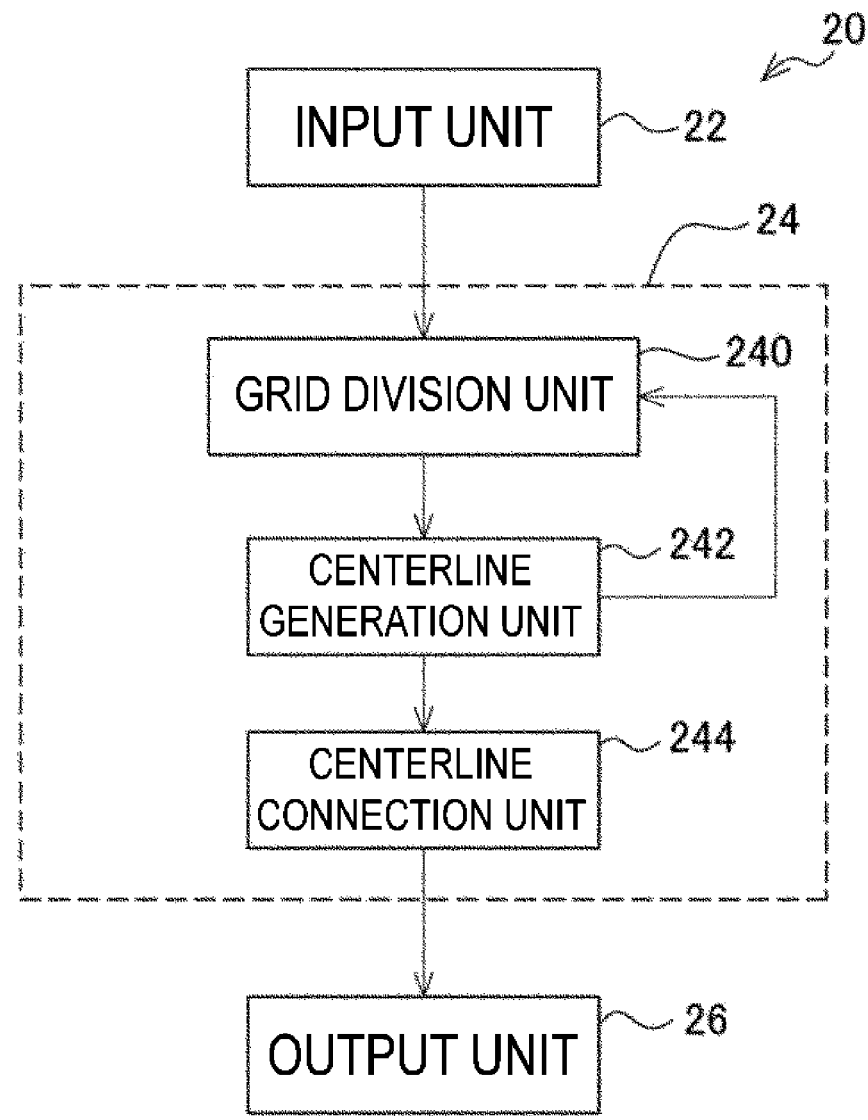
FIG. 2 is a block diagram of a centerline generation device according to the embodiment of the present invention.

Configuration of Centerline Generation Device Next, a configuration of the centerline generation device 20 will be described. As illustrated in FIG. 2, the centerline generation device 20 can be formed of a computer including a CPU, a RAM, and a ROM that stores programs and various data for executing processing routines that will be described later. The centerline generation device 20 functionally includes an input unit 22, a computing unit 24, and an output unit 26 as illustrated in FIG. 2.

The input unit 22 receives input data representing a passage from the indoor space data storage device 10. Here, a passage is a movable region in an indoor space represented by two-dimensional vector data.

Here, a passage is a space for moving between rooms. A space corresponds to a passage when the number of entrances and exits connected to the space is two or more and when the shape of the space is a concave (sunken) polygon.

The computing unit 24 includes a grid division unit 240, a centerline generation unit 242, and a centerline connection unit 244 as illustrated in FIG. 2.

The grid division unit 240 divides an indoor space represented by two-dimensional vector data in the input data into grids of a predetermined size. Details of the processing of the grid division unit 240 will be described later.

For each grid, the centerline generation unit 242 at least uses a re-entrant vertex which is an element included in the two-dimensional vector data to generate a continuous centerline which does not cross the perimeter of a passage in the indoor space and includes a plurality of straight lines.

The centerline connection unit 244 connects centerlines generated for the grids. Details of the processing of the centerline connection unit 244 will be described later.

Details of Processing of Centerline Generation Unit 242

The centerline generation unit 242 generates centerlines necessary to generate network data of the indoor space. First, why centerlines are needed to generate network data will be shown. A description will be given, for example, using shapes illustrated in FIGS. 3(A) to 3(C).

Figure 3:
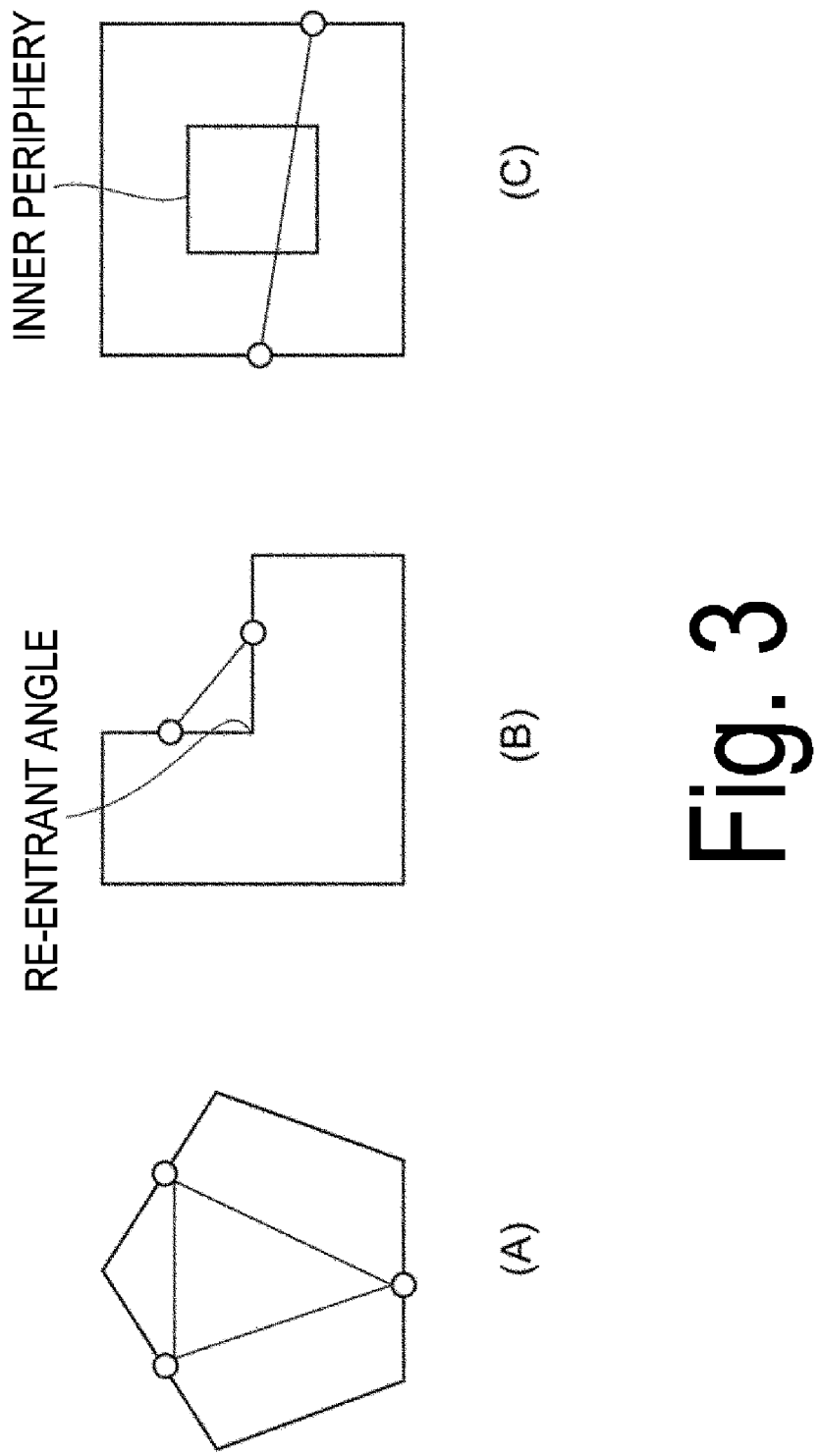
FIGS. 3(A) to 3(C) are diagrams illustrating examples of the shapes of passages in indoor spaces.

No centerlines are necessary for the shape illustrated in FIG. 3(A) because this has no re-entrant angle and thus entrances and exits can be connected by straight lines, for example, even if a plurality of entrances and exits are present at any positions on the outer periphery.

However, the shape illustrated in FIG. 3(B) has a re-entrant angle. Therefore, it may not be possible to connect an entrance and an exit by a straight line depending on the positions of the entrance and exit. That is, if the connection line goes out of the shape or crosses the outer periphery of the shape, erroneous network data will be obtained.

The shape illustrated in FIG. 3(C) has an inner periphery. Therefore, it may not be possible to connect an entrance and an exit by a straight line depending on the positions of the entrance and the exit. That is, if the connection line crosses the inner periphery of the shape, erroneous network data will be obtained.

Thus, both when the shape of a passage in an indoor space data which is input data to the centerline generation device 20 has a re-entrant angle and when the shape has an inner periphery, a centerline is generated to prevent a line that connects an entrance and an exit from going out of the shape, crossing the outer periphery of the shape, or crossing the inner periphery of the shape.

Figure 4:
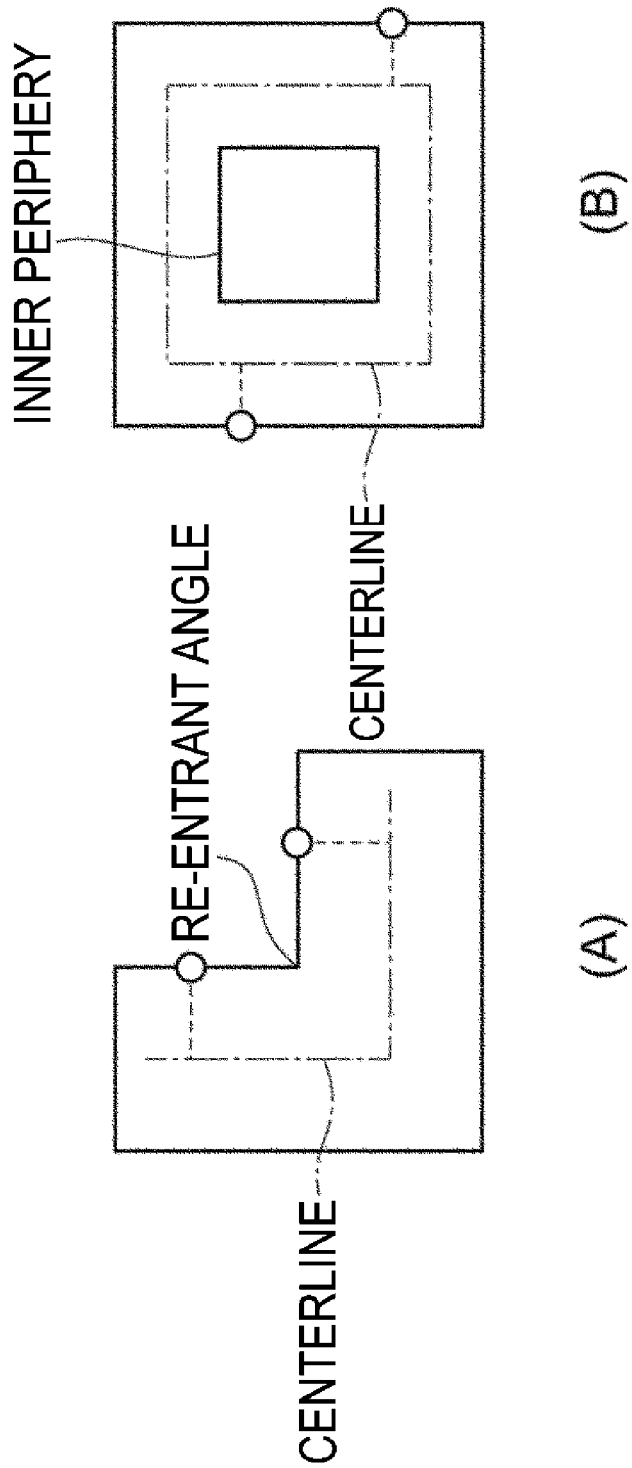
FIG. 4(A) is a diagram illustrating an example of a centerline in a shape having a re-entrant vertex and FIG. 4(B) is a diagram illustrating an example of a centerline in a shape having an inner periphery.

Network data of a passage which does not go out of the outer periphery of a shape, does not cross the outer periphery, and does not cross the inner periphery can be derived by allowing a route between an entrance and an exit to pass via a centerline for the shape as illustrated in FIGS. 4(A) and 4(B).

Here, algorithms for generating a centerline for a shape include a method using characteristics of Delaunay triangulation (Non Patent Literature 1) and an algorithm using characteristics of a Voronoi diagram (Non Patent Literature 2) or the like in the related art. However, both methods are algorithms that greatly depend on the size of the area of the shape or the complexity of the shape (the number of vertices) as described above and the results of demonstrations showed that it was difficult to apply the methods to actual data in terms of the generation cost.

Figure 5:
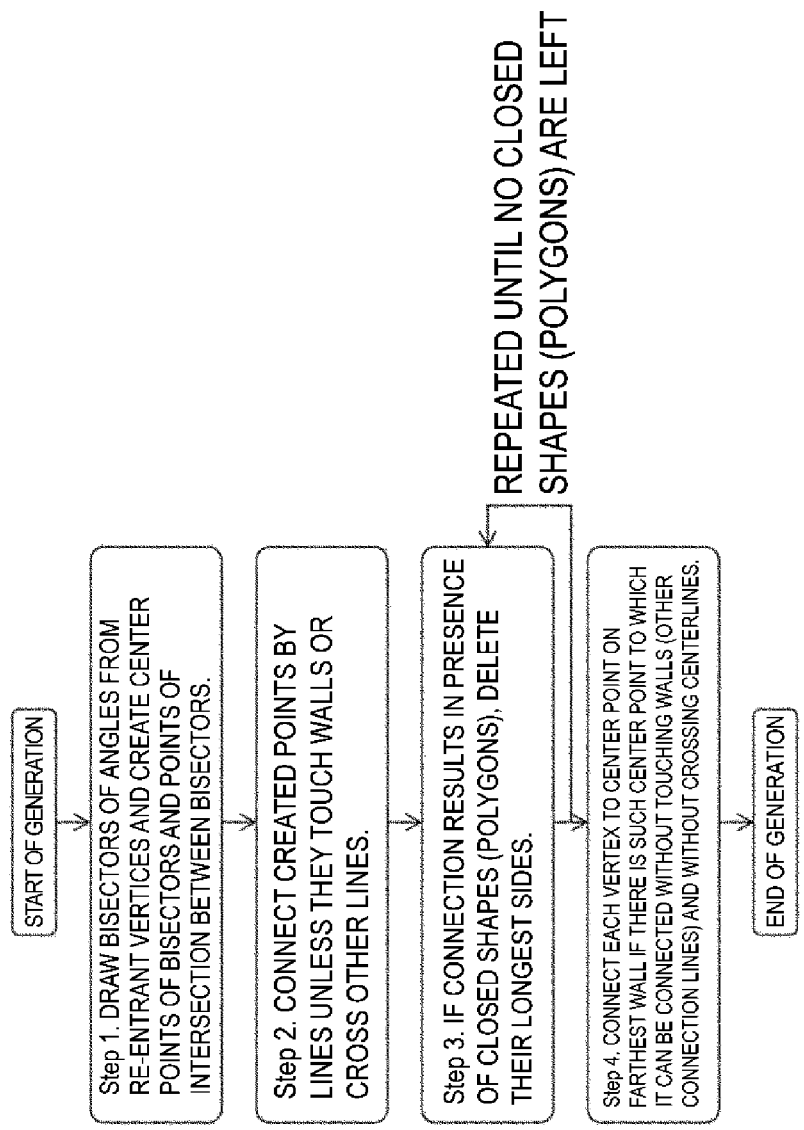
FIG. 5 is a flowchart illustrating a centerline generation logic.

Therefore, the centerline generation unit 242 generates centerlines using a generation logic that does not greatly depend on the complexity of the shape when generating centerlines. This generation logic is illustrated in FIG. 5 and transitions for centerline generation in steps of the generation logic are illustrated in FIGS. 6 to 14.

In Step 1, points where first straight lines and second straight lines constituting centerlines meet are created using re-entrant vertices. Specifically, angle bisectors are drawn from the re-entrant vertices and center points of the bisectors of the angles of the re-entrant vertices and points where the bisectors of the angles of the re-entrant vertices meet are created as points where the first straight lines and the second straight lines constituting centerlines meet.

Figure 6:
FIG. 6 is a diagram illustrating an example of the shape of a passage for which centerlines are to be generated.
Figure 7:
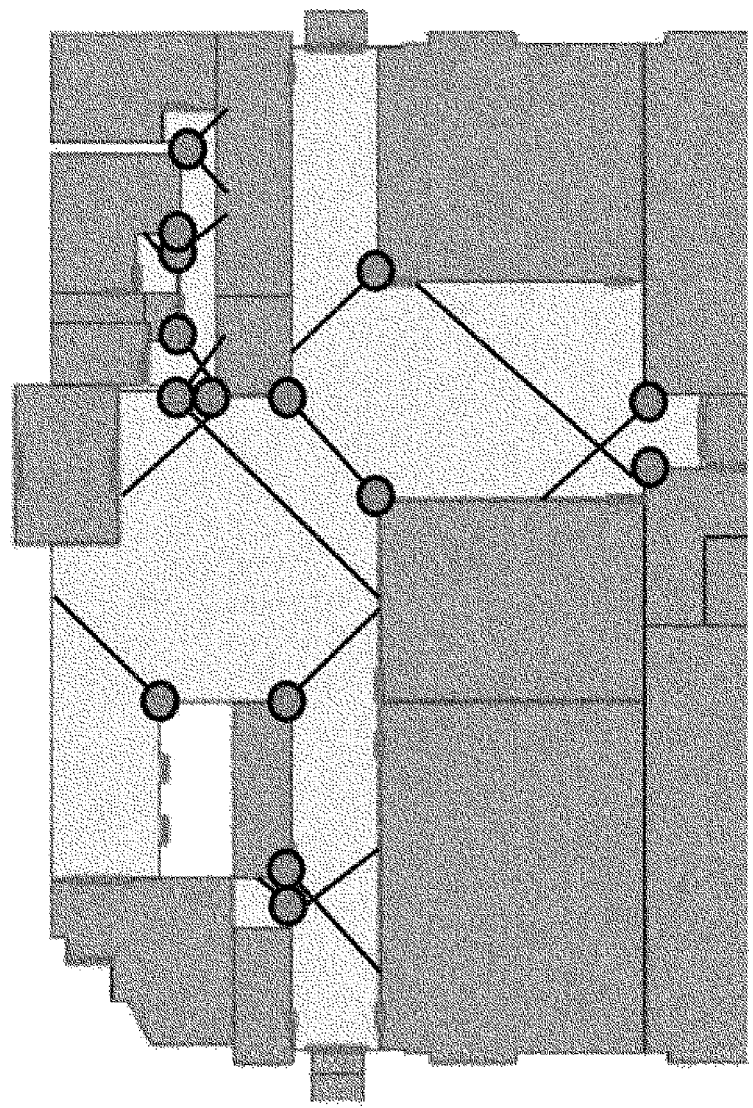
FIG. 7 is a diagram illustrating an example of a result of extracting re-entrant vertices of the shape and a result of drawing bisectors of the re-entrant vertices.

For example, from the shape of a passage in an indoor space illustrated in FIG. 6 for which centerlines are to be generated, re-entrant vertices (circles in FIG. 7) of the shape are extracted as illustrated in FIG. 7 and lines (thick lines in FIG. 7) obtained by extending the bisectors of the angles of the re-entrant vertices until they cross the perimeter of the shape are extracted (Step 1-1).

Figure 8:
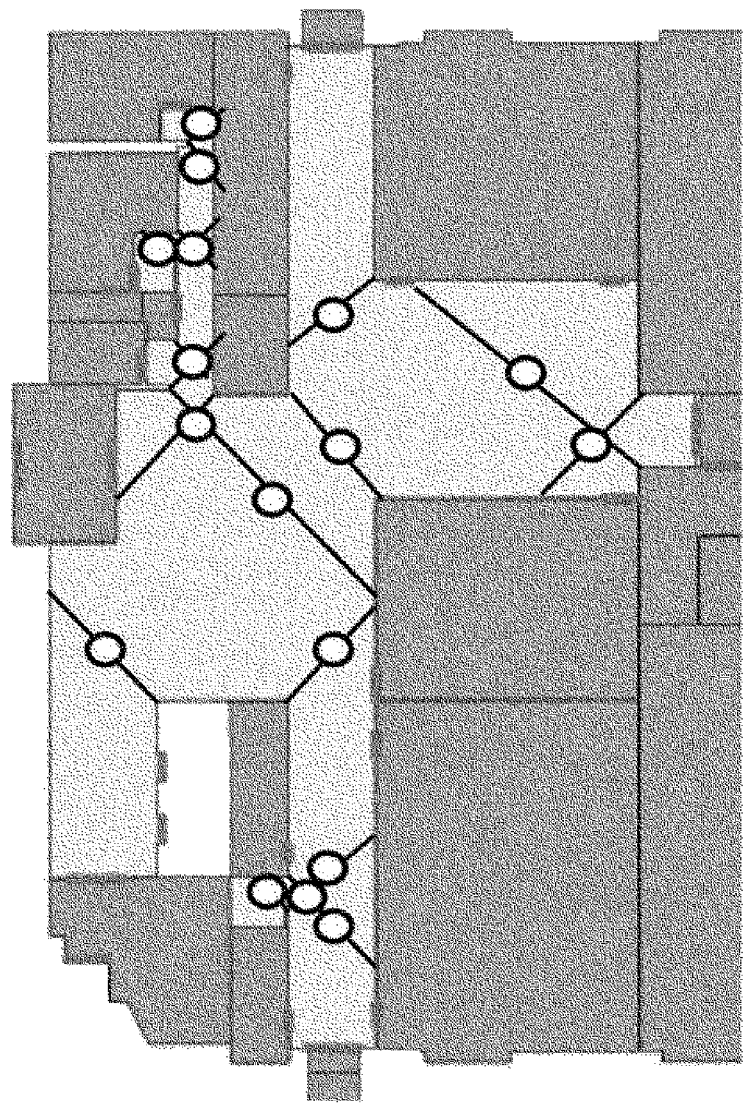
FIG. 8 is a diagram illustrating an example of midpoints of the bisectors of the re-entrant vertices and points of intersection of the bisectors of the re-entrant vertices.

Then, midpoints of the lines extracted in Step 1-1 (thick lines in FIG. 8) and points of intersection of the bisectors are extracted as illustrated in FIG. 8 (circles in FIG. 8, Step 1-2).

In Step 2, the points created in Step 1 above are connected by lines. Here, points are not connected by a line when it crosses the perimeter of the shape of the passage or when it crosses another line.

Figure 9:
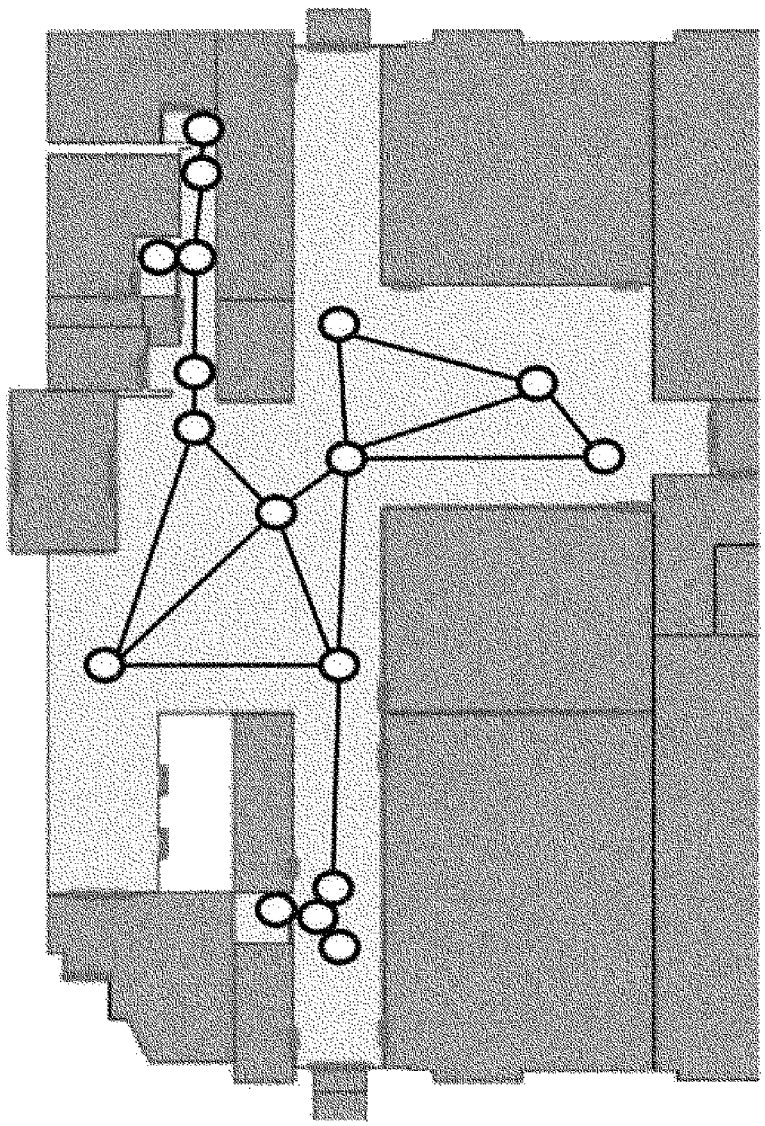
FIG. 9 is a diagram illustrating an example of a result of connecting the points in an exhaustive manner.
Figure 10:
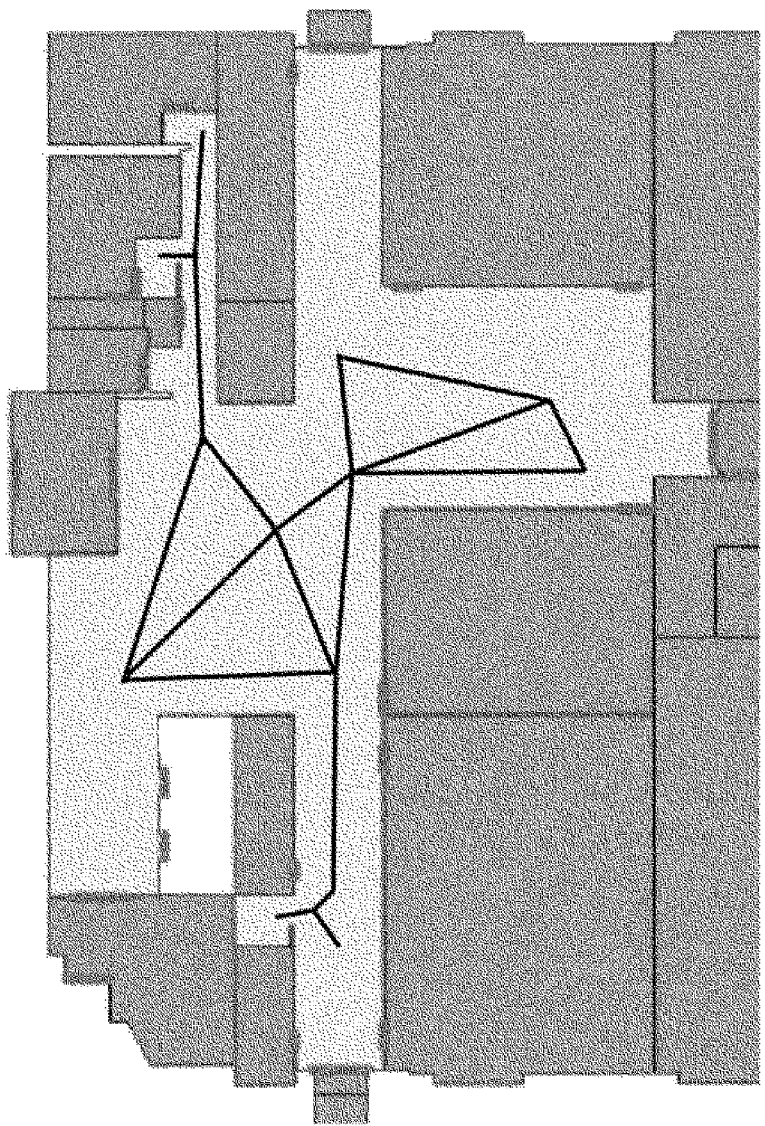
FIG. 10 is a diagram illustrating an example of connection lines.

For example, the points extracted in Step 1-2 (circles in FIG. 9) are connected in an exhaustive manner as illustrated in FIG. 9 (thick lines in FIG. 9, Step 2-1). Here, a connection is not made when crossing the perimeter of the shape of the passage and when crossing an already connected line (a thick line in FIG. 9). Thus, connection lines whereby points are connected in Step 2-1 (thick lines in FIG. 10) are obtained as illustrated in FIG. 10 (Step 2-2).

In Step 3, connection lines corresponding to the longest sides are repeatedly deleted from closed polygons defined by the connection lines obtained in Step 2 above until no closed polygons are left.

Figure 11:
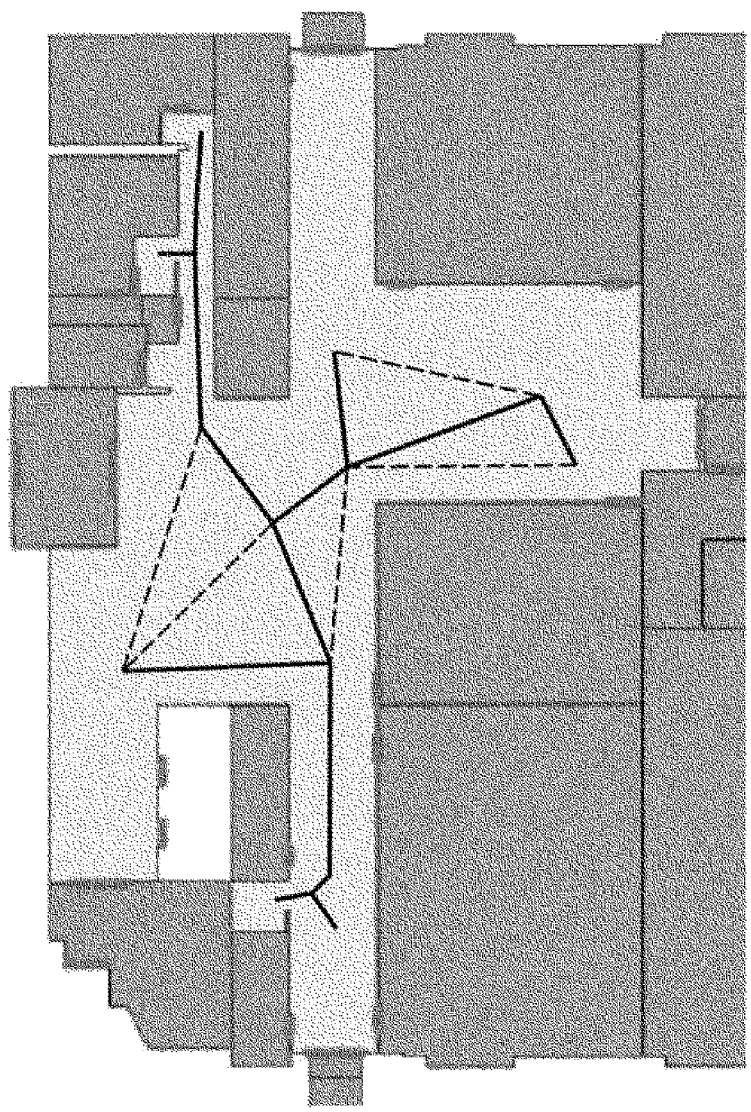
FIG. 11 is a diagram illustrating an example of a result of extracting the longest lines from combinations of lines forming closed polygons.

For example, as illustrated in FIG. 11, combinations of connection lines forming closed polygons are extracted from the connection lines obtained in Step 2-2 (thick lines in FIG. 11) and the longest connection lines (broken lines in FIG. 11) are extracted from the combinations (Step 3-1).

Figure 12:
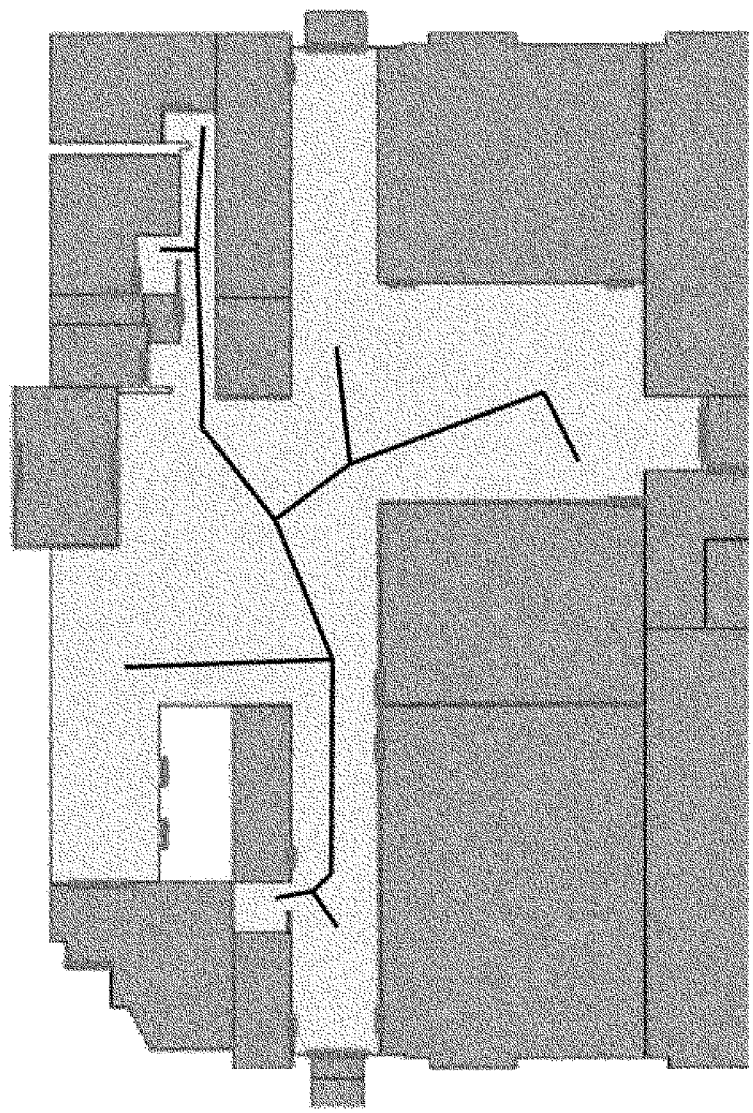
FIG. 12 is a diagram illustrating an example of a result of deleting the extracted longest lines.

Then, the longest connection lines (broken lines in FIG. 11) extracted in Step 3-1 are removed as illustrated in FIG. 12 (Step 3-2).

In Step 4, each vertex of the connection lines obtained in Step 3 above is connected to a farthest center point on the perimeter of the shape of the passage if there is such a farthest center point to which the vertex can be connected without touching the perimeter and without crossing other connection lines. Here, the vertex and the center point are not connected if there is another connection line shorter than the distance between the center point and the vertex.

Figure 13:
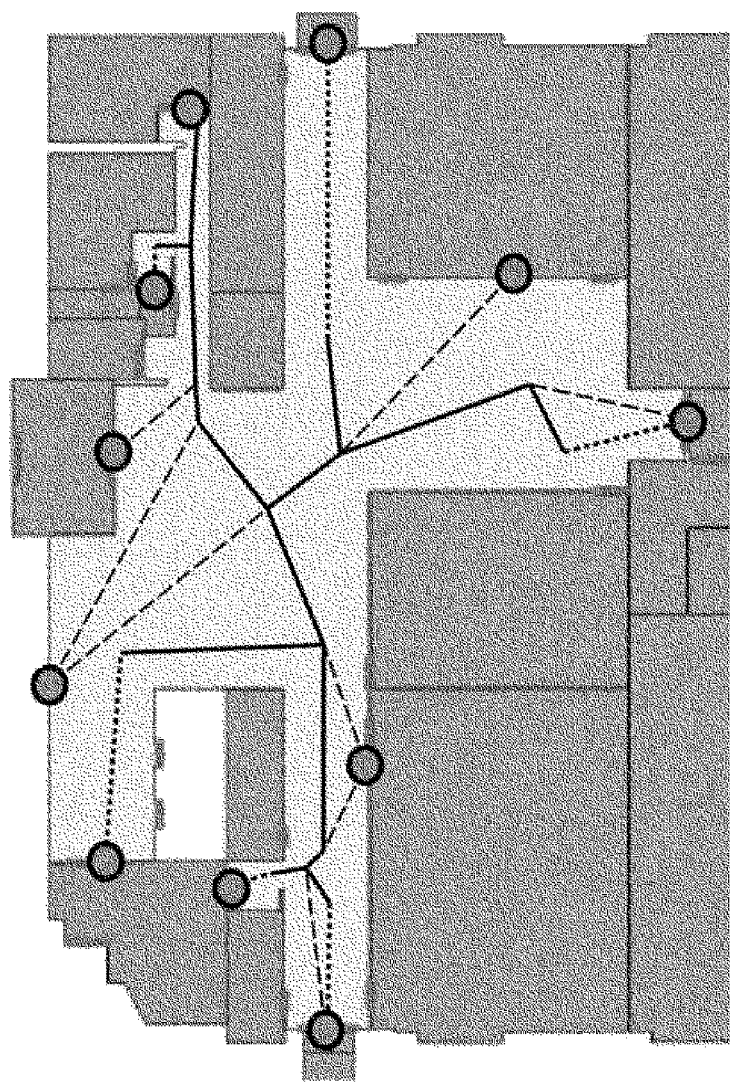
FIG. 13 is a diagram illustrating an example of a result of connecting vertices of the remaining connection lines and center points of the sides of a perimeter of the shape.

For example, as illustrated in FIG. 13, vertices of the connection lines remaining in Step 3-2 (thick lines in FIG. 13) are extracted and the vertices are connected to center points (black circles in FIG. 13) on the sides of the perimeter (the outer periphery) of the shape (Step 4-1). Here, a connection is not made when it crosses the perimeter of the shape of the passage or when it crosses an already connected connection line (a thick line in FIG. 13).

For each vertex of the connection lines remaining in Step 3-2, only the longest of the connection lines by which the vertex is connected to center points on the sides is extracted as a candidate line (a broken line in FIG. 13). However, the candidate line is removed if the shortest distance between the center point on the side which is a vertex of the candidate line (broken line) and the already connected connection line (thick line) is shorter than the length of the candidate line (broken line), otherwise the candidate line remains.

Figure 14:
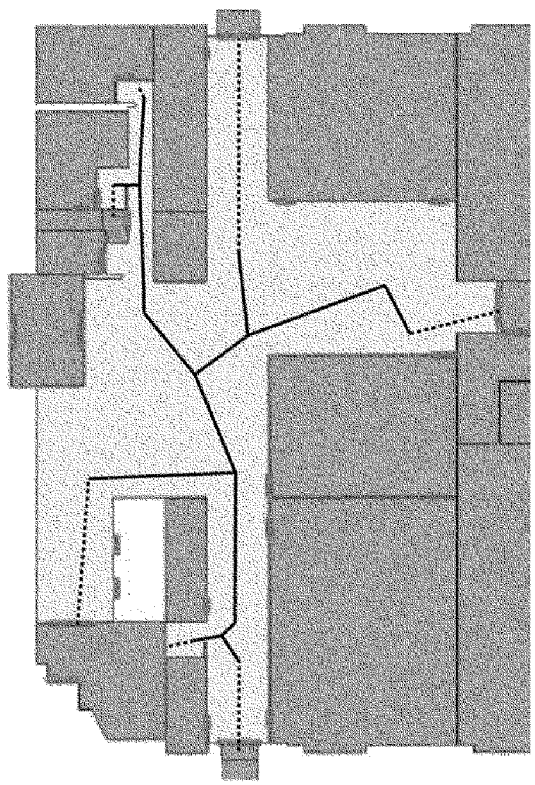
FIG. 14 is a diagram illustrating an example of the extracted connection lines and remaining candidate lines.

Thus, the connection lines extracted in Step 3-2 (thick lines in FIG. 14) and the candidate lines remaining in Step 4-1 (broken lines in FIG. 14) are obtained as illustrated in FIG. 14 (Step 4-2). These are centerlines generated using the generation logic of the present embodiment for the shape of the passage in the indoor space for which centerlines are to be generated.

Figure 15:
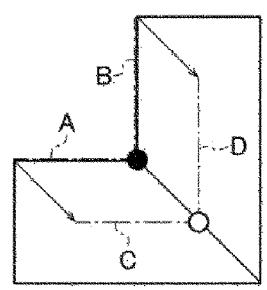
FIG. 15 is a diagram illustrating an example of a centerline when the number of re-entrant vertices is 1.

No connection lines are generated if there is only one re-entrant vertex on the shape of the passage. In this case, as illustrated in FIG. 15, lines C and D which are parallel to two sides A and B of the perimeter forming the re-entrant vertex (a black circle in FIG. 15) are generated from the center point of the bisector of the re-entrant vertex (a white circle in FIG. 15) may be generated and set as centerlines.

Details of Processing of Grid Division Unit 240 and Centerline Connection Unit 244

The generation logic of the present embodiment can significantly reduce the generation cost compared to the methods of the related art because it focuses only on the re-entrant vertices which are features of the shape of the passage.

With regard to the cost of generating centerlines from a polygon having about 10,000 vertices with such techniques, it was found that centerlines can be generated in 18 hours using the generation logic described above, while no centerlines can be generated even after several days using the methods of the related art.

However, to "delete connection lines corresponding to the longest sides from closed polygons defined by the connection lines" in Step 3 above, it is necessary to search for closed polygons in an exhaustive manner with the generated connection lines.

Also, to "connect each vertex of the connection lines to a farthest center point on the perimeter of the shape of the passage if there is such a farthest center point to which the vertex can be connected without touching the perimeter and without crossing other connection lines" in Step 4, it is necessary to perform search in an exhaustive manner with the vertices of the generated centerlines and the sides of the outer periphery among those of the perimeter of the shape of the passage.

Thus, there is a fear that the cost may increase depending on the number of generated centerlines and the number of sides of the perimeter of the shape.

Therefore, the present embodiment uses a method for improving the cost of generating centerlines using the centerline generation logic.

The centerline generation logic has the possibility of requiring a generation cost depending on the original shape although it focuses on the re-entrant vertices in consideration of limiting the generation cost as described above.

Figure 16:
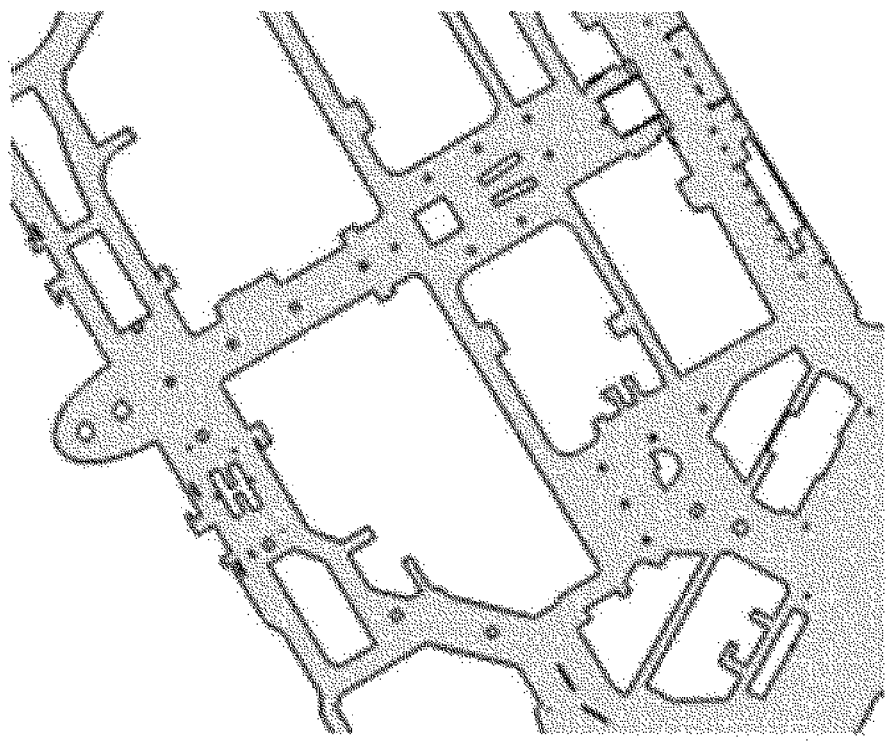
FIG. 16 is a diagram illustrating an example of complicated shapes of passages in an indoor space.
Figure 17:
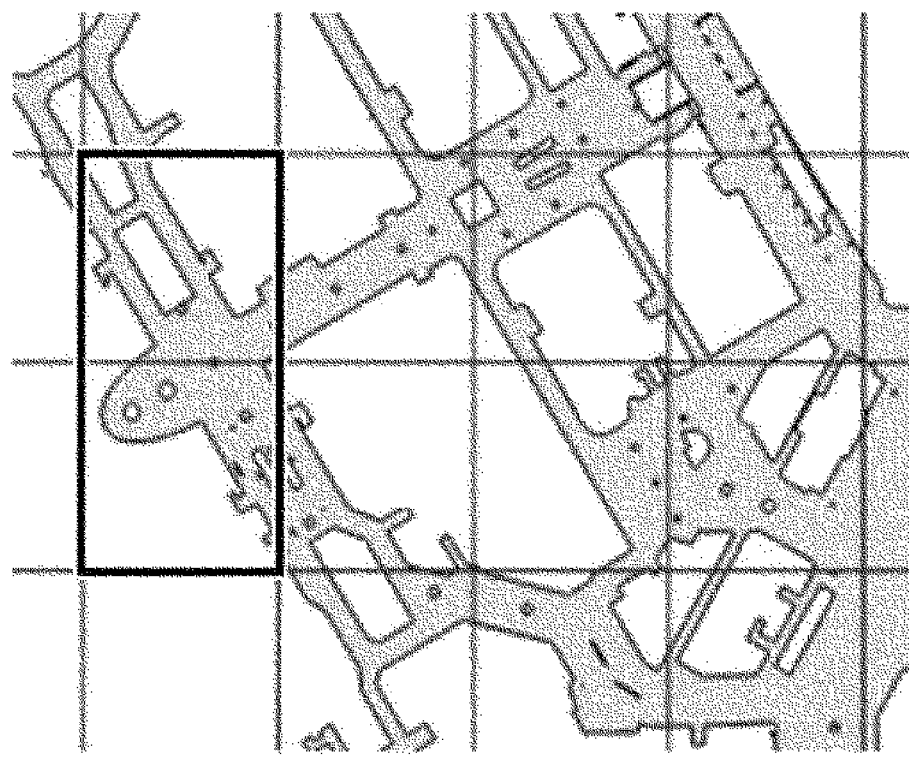
FIG. 17 is a diagram illustrating an example of a result of grid division.
Figure 18:
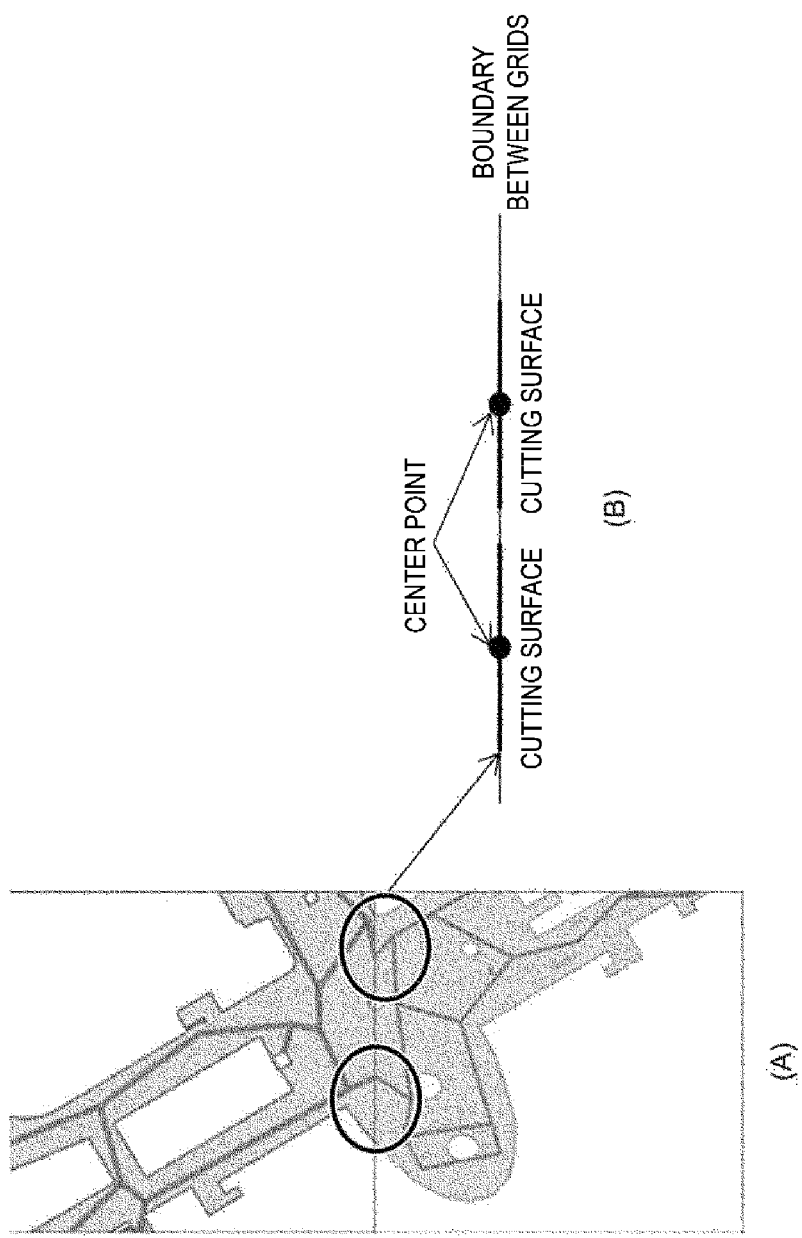
FIG. 18 is a diagram for explaining a method of connecting centerlines of grids.

Therefore, when a generation cost is necessary (for example, when the number of vertices of the original shape is large or the area thereof is large as illustrated in FIG. 16), the grid division unit 240 divides the shape of a passage in an indoor space into small units, grids, as illustrated in FIG. 17 in order to limit the generation cost. Then, the centerline generation unit 242 applies the centerline generation logic described above to each of the grids which are the small units to generate centerlines. Then, the centerline connection unit 244 connects centerlines of the grids. This reduces the number of vertices and the number of center points and reduces the generation cost because a centerline is generated for each grid as illustrated in FIG. 18(A).

The centerline connection unit 244 connects the centerlines generated for the grids. Specifically, the centerline connection unit 244 connects a center point on each grid-cutting surface (see FIG. 18(B)) to the closest vertices of already generated centerlines on both sides of the grid-cutting surface. Thus, centerlines which have the center point of each grid-cutting surface as vertices can always be generated such that centerlines of grids are always connected, thus enabling generation of a single uninterrupted centerline.

Here, if a centerline crosses the perimeter of the shape of the passage when connecting the centerline to a center point of a cutting surface between grids, the meaning of the centerline will be lost. Thus, in such a case, a bypass centerline is generated to prevent the connected centerline from crossing the perimeter of the shape.

Figure 19:
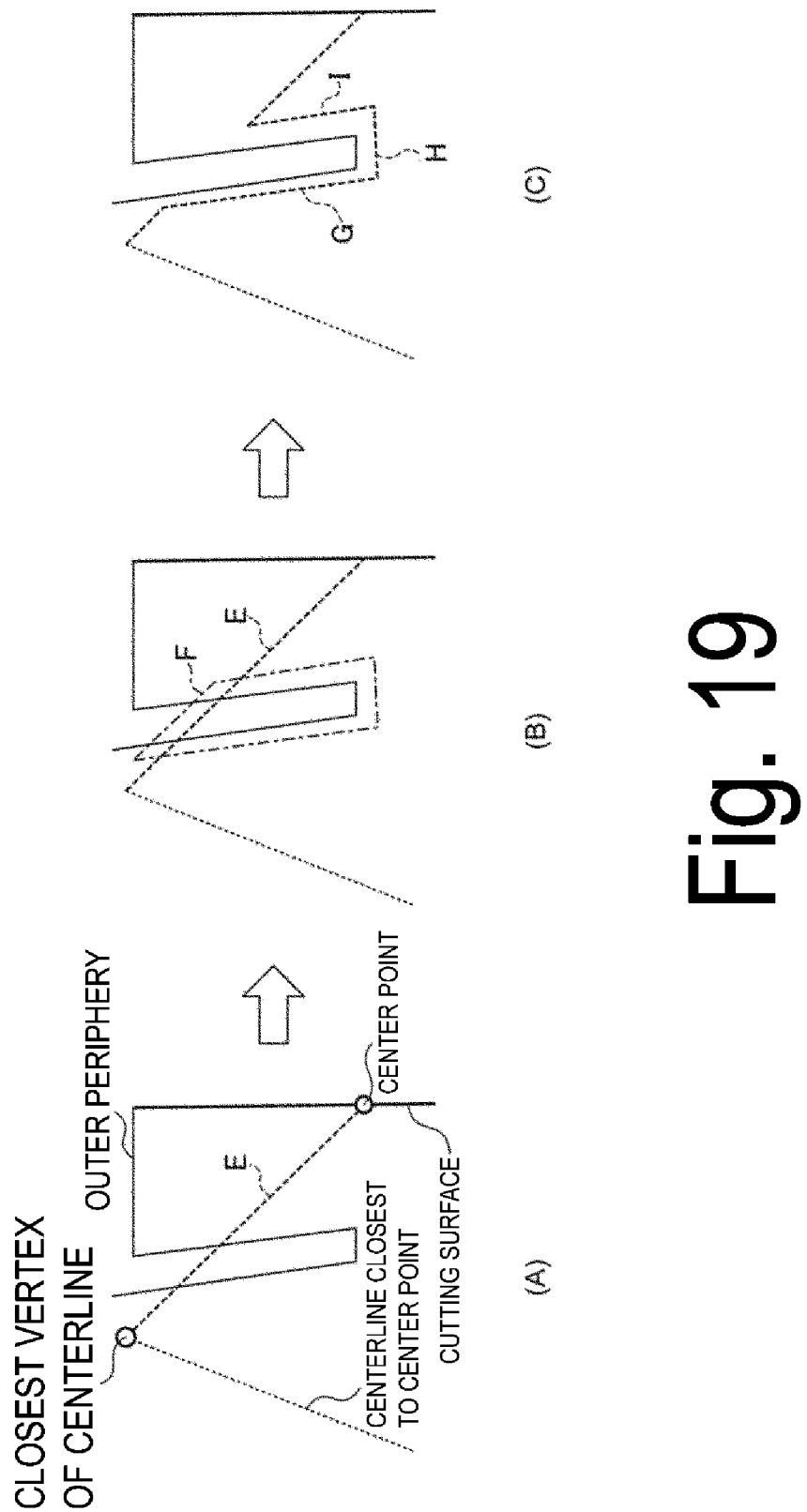
FIG. 19 is a diagram for explaining a method of generating a centerline that bypasses an outer periphery when connecting centerlines of grids.

Specifically, if a connection made between a center point of a cutting surface between grids and a vertex of a centerline closest to the center point crosses an outer periphery as illustrated in FIG. 19(A), the outer periphery is cut by a line E which connects the center point of the cutting surface and the vertex of the centerline as illustrated in FIG. 19(B). Then, a shape defined by a line F which is separated by a predetermined distance from each side of a closed polygon formed by the line E and the outer periphery is generated such that it is enlarged relative to the shape of the polygon. Then, of the sides of the generated shape, sides G, H, and I which are lines not parallel to the cutting line E are used to generate a centerline that bypasses the outer periphery as illustrated in FIG. 19(C).

Figure 20:
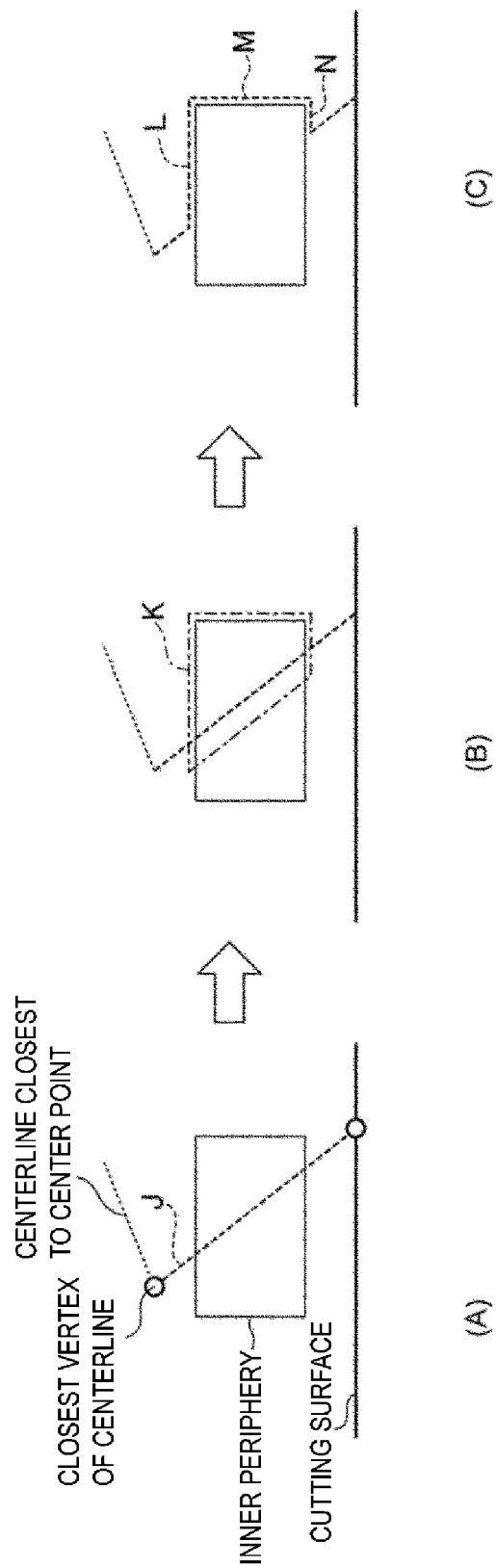
FIG. 20 is a diagram for explaining a method of generating a centerline that bypasses an inner periphery when connecting centerlines of grids.

Further, if a connection made between a center point of a cutting surface between grids and a vertex of a centerline closest to the center point crosses an inner periphery as illustrated in FIG. 20(A), the inner periphery is cut by a line J which connects the center point of the cutting surface and the vertex of the centerline as illustrated in FIG. 20(B). Then, a shape defined by a line K which is separated by a predetermined distance from each side of a polygon with the smaller area among two closed polygons formed by the line J and the inner periphery is generated such that it is enlarged relative to the shape of the polygon. Then, of the sides of the generated shape, sides L, M, and N which are lines not parallel to the cutting line J are used to generate a centerline that bypasses the inner periphery as illustrated in FIG. 20(C).

Also, if there is no centerline in a grid (there is no re-entrant vertex in a shape in the grid), a centroid of the shape of a passage in the grid may be connected to a center point of the cutting surface between grids.

Figure 21:
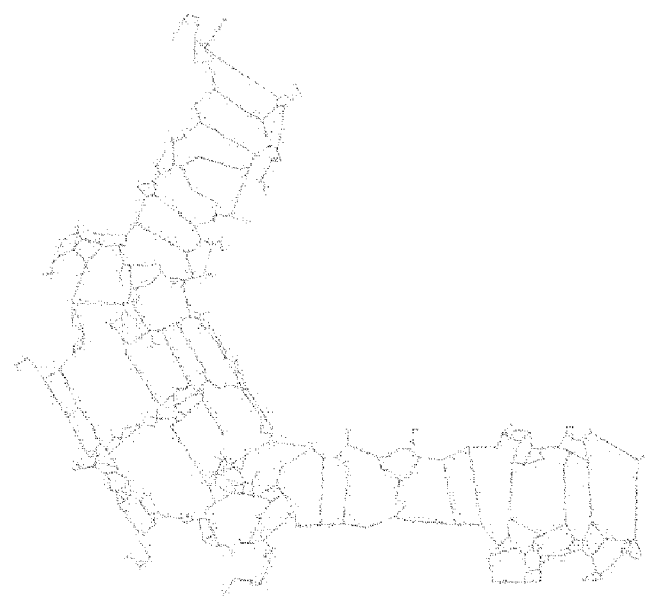
FIG. 21 is a diagram illustrating an example of centerlines generated without grid division.
Figure 22:
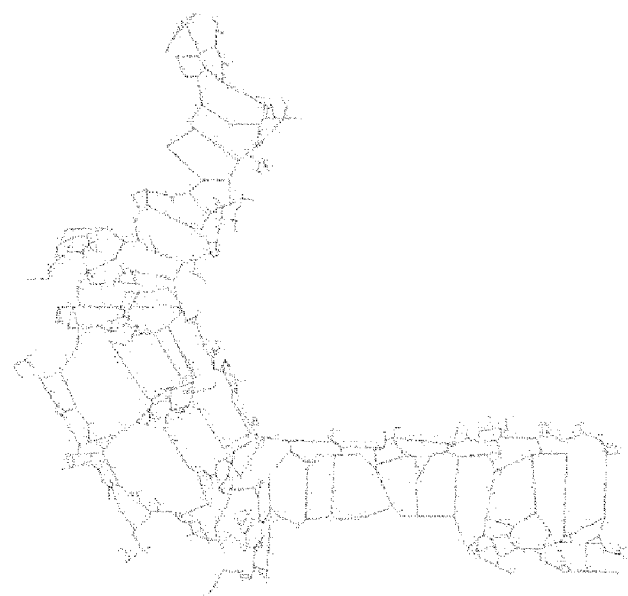
FIG. 22 is a diagram illustrating an example of centerlines generated by performing grid division.

With regard to the cost of generating centerlines from a polygon having about 10,000 vertices, for example, it took 18 hours without grid division. However, when a division was made into 100 grids of 10×10 using the grid division technique as described above according to the present embodiment, it was confirmed that calculation time could be reduced to about 2 minutes and 30 seconds without disconnecting centerlines. When centerlines generated without grid division (see FIG. 21) and centerlines obtained by connecting centerlines after grid division (see FIG. 22) were compared, it was also confirmed that their shapes do not greatly differ.

Configuration of Network Data Generation Device 40

The network data generation device 40 according to the embodiment of the present invention sorts target spaces which are parts of an indoor space from input data into rooms, passages, entrances and exits, and floor connections for each floor. Along with this, the network data generation device 40 according to the embodiment of the present invention generates nodes at vertices and points of intersection of centerlines and connects the nodes by links based on the generated centerlines to automatically generate network data for the indoor space. Here, the network data includes links representing passages and nodes that are starting or end points of the links.

Specifically, if target spaces can be sorted by the class and layer definitions of input data or by names and attribute information given to their shapes, they are sorted into rooms, passages, entrances and exits, and floor connections for each floor.

Here, rooms are spaces that can be destinations which are navigation points. A space corresponds to a room when the number of entrances and exits connected to the space is one. A space also corresponds to a room when the shape of the space is a convex polygon.

Spaces are regions that are meaningful units (such as passages or rooms) into which an indoor space is divided. Spaces are movable regions for which network data is to be generated.

Entrances and exits are locations (such as doors or parts without walls) where spaces are connected, and floor connections are locations (such as stairs, elevators, or escalators) where floors of an indoor space are connected.

Links are lines which are drawn in movable regions assuming that moving bodies (such as people, wheelchairs, strollers, robots, or drones) can move along the links. Both ends of a link are always nodes. In addition to basic attribute information such as the direction and length, each link can have features of the movable region such as the height, the width, steps, the number of steps, and handrails as attribute information. When there is a branch midway on a link or when the direction of a link is to be changed, a node is set at its starting point to divide the link.

Nodes are points that are starting or end points of links. In addition to generation of a node, for example, when changing the direction of a link (creating a curve) or when branching from a link, a node may be intentionally set midway on a link to divide the link, for example, when a navigation point is desired to be set near an entrance/exit.

In addition, by adding attribute information included in the input data to network data when generating the network data, it is possible to efficiently and automatically generate data with a higher utility value.

Here, the attribute information of the input data includes information which is directly included in "rooms", "passages", "entrances and exits", or "floor connections" as attribute information, and information which is not directly included but is obtained by automatically extracting shapes included near or inside such shapes (for example, handrails for stairs and the number of toilet bowls in toilets) or attribute information of the shapes (for example, the materials of floors in the spaces).

When attribute information is added such that the same attribute information is added to a plurality of pieces of network data, it is also possible to reduce the amount of data by separately generating a POI and adding an ID thereof to the attribute information. Here, POI is an abbreviation for point of interest and is used to manage representative points for the shapes of spaces (such as stores, rooms, or toilets) and their attributes.

Operation of Centerline Generation Device
According to Embodiment of Present Invention Next, the operation of the centerline generation device 20 according to the embodiment of the present invention will be described.

Figure 23:
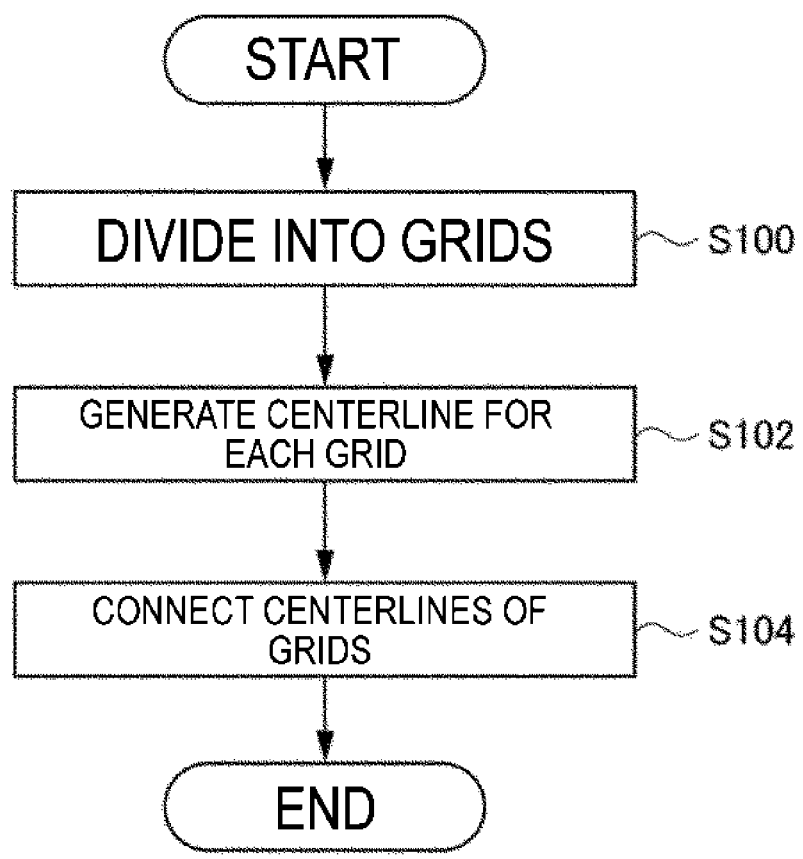
FIG. 23 is a flowchart illustrating a centerline generation processing routine for the centerline generation device according to the embodiment of the present invention.

First, input data representing passages, which are movable regions in an indoor space represented by two-dimensional vector data, is stored in advance in the indoor space data storage device 10. Then, upon receiving the input data stored in the indoor space data storage device 10 through the input unit 22, the centerline generation device 20 executes a centerline generation processing routine illustrated in FIG. 23.

First, in step S100, the indoor space represented by the two-dimensional vector data is divided into grids of a predetermined size based on the input data.

Then, in step S102, for each grid, a centerline of a passage in the grid is generated according to the generation logic illustrated in FIG. 5.

In step S104, centerlines generated for the grids are connected to generate a single continuous centerline and the centerline is stored in the centerline data storage device 30 through the output unit 26 and then the centerline generation processing routine ends.

As described above, the centerline generation device according to the embodiment of the present invention at least uses the following re-entrant vertex to generate the following centerline, whereby it is possible to generate a centerline for generating network data of an indoor space while limiting the amount of calculation. Here, the "re-entrant vertex" refers to an element included in two-dimensional vector data that represents a passage in the indoor space. Further, the "centerline" refers to a continuous centerline that does not cross a perimeter of the passage in the indoor space and includes a plurality of straight lines.

In addition, the network data generation system according to the embodiment of the present invention can generate network data of indoor spaces with limited amount of calculation by limiting the amount of calculation in centerline generation.

The present invention is not limited to the above embodiment and various modifications and applications are possible without departing from the scope of the present invention.

Centerlines may be generated without grid division, for example, when the shape of an input indoor space has a small area or a small number of vertices.

Although the centerline generation device 20 described above has a computer system inside, it is assumed that the "computer system" also includes a website providing environment (or display environment) when a WWW system is used.

Further, although the embodiment has been described in which a program is installed in advance in the present specification, the program can also be stored and provided in a computer-readable recording medium or can be provided via a network.

REFERENCE SIGNS LIST

10 Indoor space data storage device
20 Centerline generation device
22 Input unit
24 Computing unit
26 Output unit
30 Centerline data storage device
40 Network data generation device
50 Network data storage device
100 Network data generation system
240 Grid division unit
242 Centerline generation unit
244 Centerline connection unit

The invention claimed is:

1. A centerline generation device for generating a centerline of a passage that is a movable region in an indoor space represented by two-dimensional vector data, the centerline generation device comprising:
a centerline generator configured to at least use a re-entrant vertex which is an element included in the two-dimensional vector data to generate a continuous centerline which does not cross a perimeter of the passage in the indoor space and includes a plurality of straight lines, wherein the centerline generator acquires at least one point where a first straight line and a second straight line meet using the re-entrant vertex and connects the acquired points to generate the centerline.

2. The centerline generation device according to claim 1, wherein the centerline generator generates the centerline using a bisector of an angle of the re-entrant vertex.

3. The centerline generation device according to claim 2, wherein the centerline generator extracts a center point of the bisector of the angle of the re-entrant vertex and a point where the bisectors of the re-entrant vertices meet and connects the extracted points to generate the centerline.

4. The centerline generation device according to claim 1, wherein the centerline generator further deletes a centerline corresponding to a longest side from a closed polygon defined by the generated centerlines.

5. The centerline generation device according to claim 1, further comprising:
a grid divider configured to divide the indoor space represented by the two-dimensional vector data into grids of a predetermined size; and
a centerline connector,
wherein the centerline generator is configured to generate the centerlines for the grids, and
the centerline connector is configured to connect the centerlines generated for the grids.

6. A network data generation system, the system comprising:
a centerline generation device for generating a centerline of a passage that is a movable region in an indoor space represented by two-dimensional vector data, the centerline generation device comprising:
the centerline generator configured to at least use a re-entrant vertex which is an element included in the two-dimensional vector data to generate a continuous centerline which does not cross a perimeter of the passage in the indoor space and includes a plurality of straight lines, wherein the centerline generator acquires at least one point where a first straight line and a second straight line meet using the re-entrant vertex and connects the acquired points to generate the centerline; and
a network data generation device configured to generate network data which includes a link representing the passage and a node that is a starting or end point of the link based on the generated centerlines.

7. A non-transitory computer-readable storage medium storing computer-executable instructions that when executed by a processor cause a computer system as a centerline generation device for generating a centerline of a passage that is a movable region in an indoor space represented by two-dimensional vector data, the centerline generation device comprising:
a centerline generator configured to at least use a re-entrant vertex which is an element included in the two-dimensional vector data to generate a continuous centerline which does not cross a perimeter of the passage in the indoor space and includes a plurality of straight lines, wherein the centerline generator acquires at least one point where a first straight line and a second straight line meet using the re-entrant vertex and connects the acquired points to generate the centerline.

8. The centerline generation device according to claim 3, wherein the centerline generator further deletes a centerline corresponding to a longest side from a closed polygon defined by the generated centerlines.

9. The system of claim 6, wherein the centerline generator generates the centerline using a bisector of an angle of the re-entrant vertex.

10. The system of claim 9, wherein the centerline generator extracts a center point of the bisector of the angle of the re-entrant vertex and a point where the bisectors of the re-entrant vertices meet and connects the extracted points to generate the centerline.

11. The system of claim 6, wherein the centerline generator further deletes a centerline corresponding to a longest side from a closed polygon defined by the generated centerlines.

12. The system of claim 6, the system further comprising:
a grid divider configured to divide the indoor space represented by the two-dimensional vector data into grids of a predetermined size; and
a centerline connector,
wherein the centerline generator is configured to generate the centerlines for the grids, and the centerline connector is configured to connect the centerlines generated for the grids.

13. The system of claim 10, wherein the centerline generator further deletes a centerline corresponding to a longest side from a closed polygon defined by the generated centerlines.

14. The non-transitory computer-readable storage medium of 7, wherein the centerline generator generates the centerline using a bisector of an angle of the re-entrant vertex.

15. The non-transitory computer-readable storage medium of 14, wherein the centerline generator extracts a center point of the bisector of the angle of the re-entrant vertex and a point where the bisectors of the re-entrant vertices meet and connects the extracted points to generate the centerline.

16. The non-transitory computer-readable storage medium of 7, wherein the centerline generator further deletes a centerline corresponding to a longest side from a closed polygon defined by the generated centerlines.

17. The non-transitory computer-readable storage medium of 7, the computer system further comprising:
a grid divider configured to divide the indoor space represented by the two-dimensional vector data into grids of a predetermined size; and
a centerline connector,
wherein the centerline generator is configured to generate the centerlines for the grids, and
the centerline connector is configured to connect the centerlines generated for the grids.

18. The centerline generation device according to claim 1, wherein the re-entrant vertex is associated with a perimeter of a shape of the passage in the input indoor space.

19. The system of claim 6, wherein the re-entrant vertex is associated with a perimeter of a shape of the passage in the input indoor space.

20. The non-transitory computer-readable storage medium of 7, wherein the re-entrant vertex is associated with a perimeter of a shape of the passage in the input indoor space.

* * * * *